US006876015B2

(12) United States Patent
Mori (10) Patent No.: US 6,876,015 B2
(45) Date of Patent: Apr. 5, 2005

(54) SEMICONDUCTOR DEVICES

(75) Inventor: Katsumi Mori, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 36 days.

(21) Appl. No.: 10/202,063

(22) Filed: Jul. 25, 2002

(65) Prior Publication Data

US 2003/0038304 A1 Feb. 27, 2003

(30) Foreign Application Priority Data

Jul. 25, 2001 (JP) ........................................ 2001-224690

(51) Int. Cl.⁷ .............................................. H01L 27/10
(52) U.S. Cl. ........................ 257/209; 257/529; 257/530
(58) Field of Search ........................ 257/209, 520–530, 257/13, 665, 910

(56) References Cited

U.S. PATENT DOCUMENTS

| 6,320,243 | B1 |  | 11/2001 | Jeong et al. |
|---|---|---|---|---|
| 6,366,503 | B2 | * | 4/2002 | Sonoda |
| 6,413,848 | B1 | * | 7/2002 | Giust et al. |
| 6,433,406 | B1 |  | 8/2002 | Kagiwata |
| 6,509,624 | B1 | * | 1/2003 | Radens et al. |
| 2002/0125576 | A1 |  | 9/2002 | Koyama et al. |
| 2003/0038339 | A1 |  | 2/2003 | Mori |
| 2003/0052385 | A1 |  | 3/2003 | Mori |

FOREIGN PATENT DOCUMENTS

| JP | 09-172087 | 6/1997 |
|---|---|---|
| JP | 11-087521 | 3/1999 |
| JP | 11-260922 | 9/1999 |
| JP | 2000-243845 | 9/2000 |
| JP | 2000-268699 | 9/2000 |

OTHER PUBLICATIONS

Notice of Reasons of Rejection for Japanese Patent Application No. 2001–224690 (from which priority was claimed for 10/202,063) dated Jun. 10, 2003 (which lists 11–260922 and 2000–243845 cited above).

Notice of Reasons of Rejection for Japanese Patent Application No. 2001–224689 (from which priority was claimed for 10/202,044) dated Jun. 10, 2003 (which lists 09–172087 cited above).

Notice of Reasons of Rejection for Japanese Patent Application No. 2001–224688 (from which priority was claimed for 10/202,028) dated Jun. 10, 2003 (which lists 2000–268699 and 11–087521 cited above).

* cited by examiner

*Primary Examiner*—Fetsum Abraham
(74) *Attorney, Agent, or Firm*—Konrad Raynes & Victor, LLP; Alan S. Raynes (57) ABSTRACT

A semiconductor device may include a fuse section 110 in which a plurality of fuses 20 to be fused by irradiation of a laser beam are formed. The fuses 20 are arranged at a pitch X, and an insulation layer 36 having a specified film thickness covers upper portions of the fuses 20. The fuses 20 may have a width W and a film thickness T that have a relation indicated by the following equation: T≧0.4/W. Furthermore, the width W of the fuse 20 may be 3 μm or less, and may be less than ½ of the pitch X of the fuses 20. Also, the film thickness of the fuse 20 may be 0.7 μm or less.

23 Claims, 6 Drawing Sheets

SEMICONDUCTOR DEVICES

Applicant claims priority in and hereby incorporates by reference Japanese Application No. 2001-224690, filed Jul. 25, 2001, in its entirety. Applicant hereby incorporates by reference U.S. application Ser. No. 10/202,044, filed Jul. 25, 2002, in its entirety. Applicant hereby incorporates by reference U.S. application Ser. No. 10/202,028, filed Jul. 25, 2002, in its entirety.

TECHNICAL FIELD

The present invention relates to semiconductor devices including fuses, and includes semiconductor devices including fuses that may be fused by irradiation of a laser beam.

RELATED ART

Currently, replacement circuits are built in semiconductor devices in order to substitute for circuits that might become defective due to deficiencies that could occur during the manufacturing process. For example, in the case of a semiconductor memory device, since many of the deficiencies that occur during the manufacturing process would occur in its memory section, multiple redundant memory cells in units of word lines or bit lines are generally disposed therein. A redundant circuit controls the redundant memory cells. When a deficient element is generated in one chip that forms a semiconductor device, the redundant circuit provides a function to switch the deficient element to a normal element by irradiating a laser beam to a fuse element having an address corresponding to the deficient element to thereby fuse (break) the fuse element.

Due to demands in recent years in higher integration of semiconductor devices, memories have been further miniaturized. In connection with this trend, fuse elements themselves have also been miniaturized. Reliability of the fuse elements affects the production yield of semiconductor memory devices, and therefore highly reliable fusing of fuse elements is desired. Improvements in the reliability in fusing fuse elements can improve the production yield of semiconductor devices.

BRIEF DESCRIPTION OF THE DRAWINGS

Embodiments of the invention are described with reference to the accompanying drawings which, for illustrative purposes, are schematic and not necessarily drawn to scale.

SUMMARY

Certain embodiments relate to a semiconductor device including a plurality of fuses arranged at a specified pitch X, wherein the fuses are adapted to be fused by irradiation of a laser beam. The semiconductor device also includes an insulation layer formed in a manner to cover the fuses. The fuses have a width W of 3 μm or less and a film thickness T of 0.7 μm or less. In addition, the width W and the film thickness T of the fuses satisfies Equation (1) as follows:

$$T \geq 0.4/W \qquad \text{Equation (1)}$$

Certain embodiments also relate to a semiconductor device including a circuit section and a fuse section including a plurality of fuses. At least one of the plurality of fuses has a width W of 3 μm or less. The at least one of the plurality of fuses has a film thickness T of 0.7 μm or less. In addition, the width W and the film thickness T of the at least one of the plurality of fuses satisfies the following equation: $T \geq 0.4/W$.

DETAILED DESCRIPTION

A semiconductor device in accordance with an embodiment of the present invention comprises:

a plurality of fuses arranged at a specified pitch X wherein the fuses are to be fused by irradiation of a laser beam; and an insulation layer formed in a manner to cover the plurality of fuses, wherein the fuse has a width W of 3 μm or less, the fuse has a film thickness T of 0.7 μm or less, and the width W of the fuse and the film thickness T of the fuse satisfy Equation (1) as follows:

$$T \geq 0.4/W \qquad \text{Equation (1)}$$

In the present embodiment, the width W and the film thickness T of the fuse correspond to a width and a film thickness of the fuse in a cross section thereof where the fuse is cut in a plane perpendicular to a longitudinal direction of the fuse.

In accordance with the present embodiment, when Equation (1) is satisfied, the fuse can be accurately fused, and therefore the production yield can be improved. More description thereof will be described below in embodiments of the present invention.

The following semiconductor devices in accordance with preferred embodiments of the present invention indicated in sections (1)–(9) below may be listed as examples.

(1) The width W of the fuse may preferably be less than ½ of the pitch X. According to this structure, a ratio of line to space (line/space) of the fuses is less than one. In other words, the space has a greater proportion. As a result, margins for a photolithography process can be secured. Accordingly, miniaturized and precisely formed fuses can be obtained.

(2) The width W of the fuse may preferably be two times or greater than the film thickness T of the fuse. According to this structure, for example, materials composing the fuse would more readily vaporize at the time of fusing, and thus more stable fusing can be achieved, compared to, for example, a fuse having a width and a film thickness that are generally equal to each other.

(3) The film thickness T of the fuse may preferably be between 0.25 μm and 0.7 μm. Also, the width W of the fuse may preferably be between 1.0 μm and 3.0 μm. Further, the pitch X of the fuses may preferably be between 2.0 μm and 10.0 μm.

(4) The insulation layer may preferably have a film thickness between 0.2 μm and 1 μm. According to this structure, the fuse can be accurately fused by irradiation of a laser beam without harming the reliability of the semiconductor device.

(5) The fuses may be formed at a bottom section of an opening section formed on a substrate including a semiconductor region.

(6) Furthermore, the semiconductor device may further include a circuit section having a structure of multiple wiring layers, and the fuses may be formed in a layer at a level identical with that of one of the wiring layers that compose the circuit section.

In this case, the fuses may preferably be formed in a layer at a level identical with that of one of the wiring layers below an uppermost wiring layer among the wiring layers of the circuit section. According to this structure, the degree of freedom in circuit design can be improved, compared to the case in which fuses are formed at the same level of the uppermost wiring layer. Furthermore, in accordance with this structure, since a pad wiring layer is normally formed at the same level as that of the uppermost wiring layer, the process of removing an insulation layer formed on the pad wiring layer and the process of removing an insulation layer on the fuses can be controlled at the same time, which can improve the efficiency in the manufacturing process.

Also, in this case, the film thickness T of the fuse may be made generally equal to a film thickness of one of the wiring layers that compose the circuit section.

(7) The fuses may preferably be formed from material comprising, as a main component, of any of aluminum, copper, polysilicon, tungsten and titanium.

(8) The width W of the fuse and the film thickness T of the fuse may preferably have a relation represented by Equation (2) as follows:

$$T = A/W \text{ (where, } A \text{ is } 0.4 \leq A \leq 0.6) \qquad \text{Equation (2)}.$$

In this case, the fuses may preferably comprise aluminum, and A in Equation (2) may preferably be 0.45 or greater but 0.5 or smaller.

(9) At least a part of the fuses can be fused.

A preferred embodiment of the present invention will be described with reference to the accompanying drawings.

Figure 1:
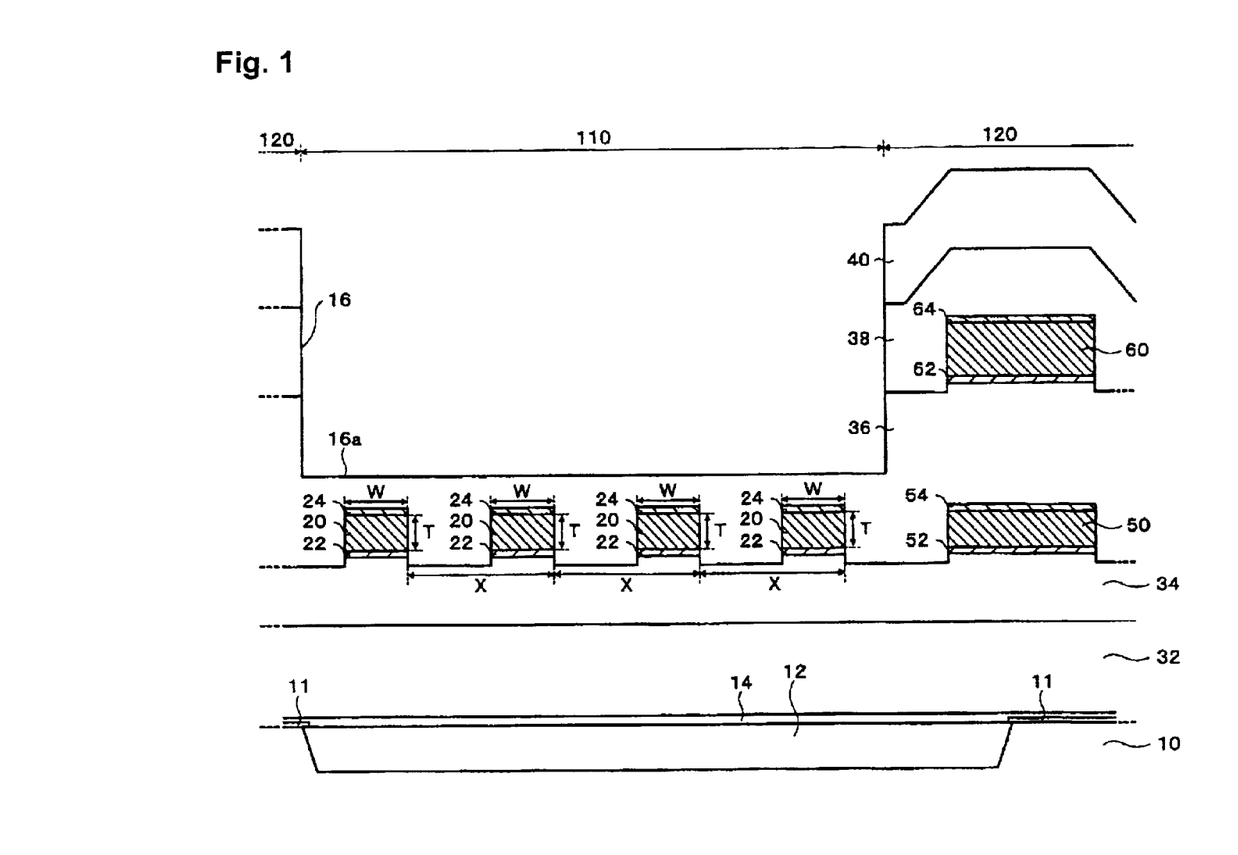
FIG. 1 schematically shows a cross-sectional view of a semiconductor device in accordance with one embodiment of the present invention.
Figure 2:
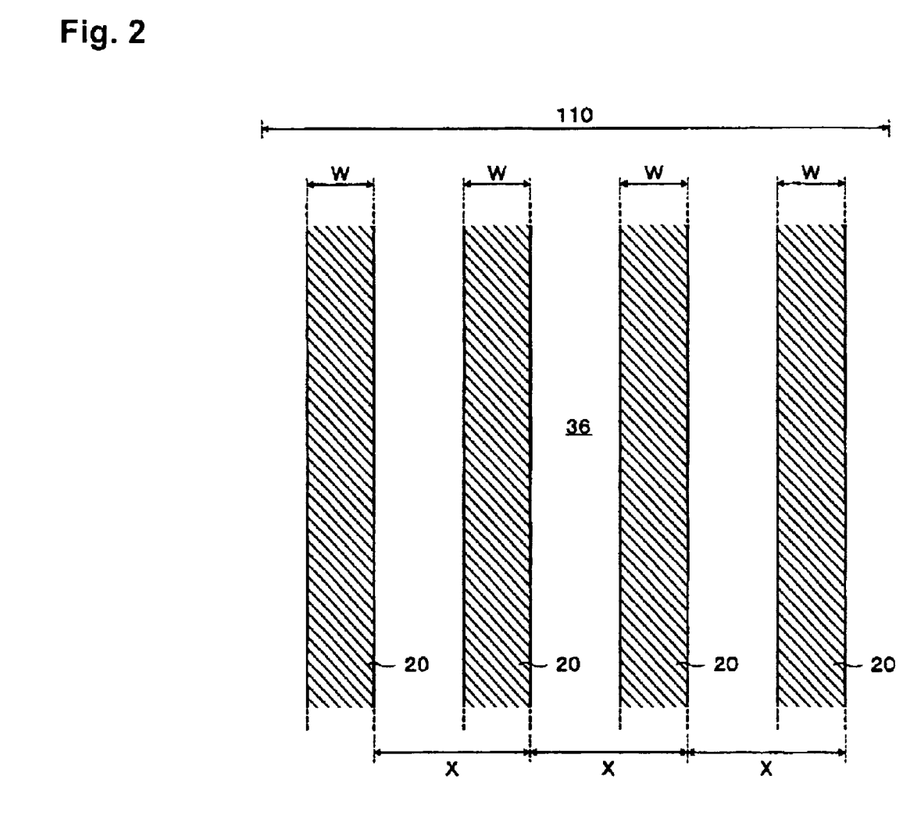
FIG. 2 schematically shows a plan view of fuses formed in the semiconductor device shown in FIG. 1.
Figure 3:
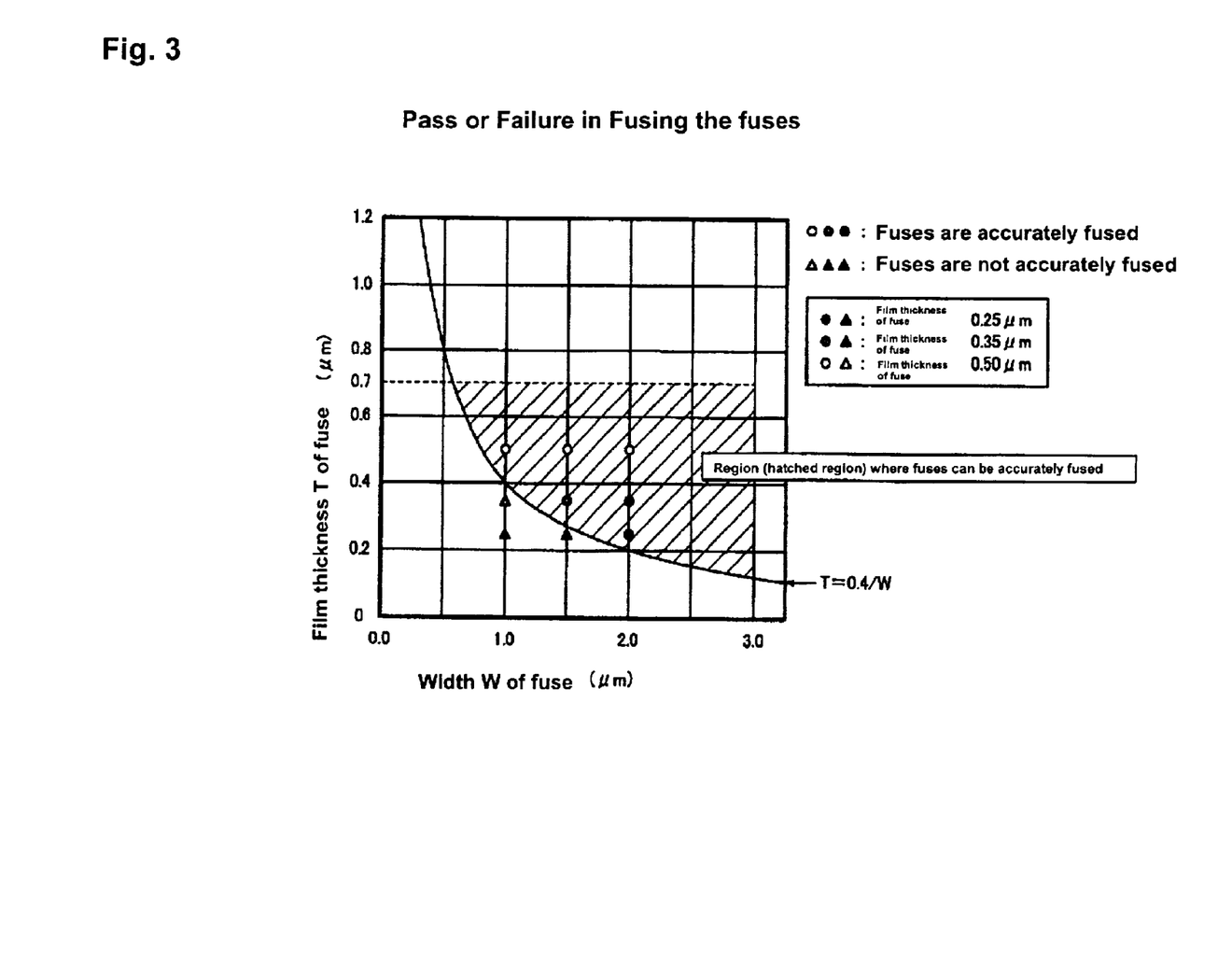
FIG. 3 shows a result of fusing experiments conducted on the fuses formed in the semiconductor device shown in FIG. 1, and indicates relations between the width W and the film thickness T of the fuses.

FIG. 1 schematically shows a cross-sectional view of a semiconductor device in accordance with an embodiment of the present invention. FIG. 2 schematically shows a plan view of fuses 20 formed in the semiconductor device shown in FIG. 1. FIG. 3 shows a result of fusing experiments conducted on the fuses formed in the semiconductor device shown in FIG. 1, and indicates relations between the width W and the film thickness T of the fuses.

The semiconductor device in accordance with the present embodiment has, as shown in FIG. 1, a circuit section 120 having a structure with multiple wiring layers, and a fuse section 110 including a plurality of fuses 20 that may be fused by irradiation of laser light. It is noted that FIG. 1 shows a structure of the fuses 20 before being fused.

The circuit section 120 and the fuse section 110 are both formed on a silicon substrate 10. It is noted that the substrate may not be limited to a silicon substrate but may be any substrate that includes a semiconductor region, including, for example, a GaAs substrate, a SiGe substrate, and a SOI substrate in which a thin film of silicon layer is formed on an insulation material. First-fourth interlayer dielectric layers 32, 34, 36 and 38 are deposited on the silicon substrate 10 in layers in this order from the side of the silicon substrate 10. The first-fourth interlayer dielectric layers 32, 34, 36 and 38 may preferably be formed from layers of silicon oxide or FSG (fluorinated silicate glass) or layers of these materials.

Through holes may be formed in the first-fourth interlayer dielectric layers 32, 34, 36 and 38 at specified locations, respectively. Conductive material may be embedded in the through holes to thereby form contact sections. Wiring layers formed above and below each of the interlayer dielectric layers are mutually electrically connected by the contact sections. Furthermore, a passivation layer 40, which may be formed from, for example, a silicon nitride layer, is preferably formed on the fourth interlayer dielectric layer 38.

The circuit section 120 includes a circuit that includes elements such as, for example, transistors. A memory circuit, a liquid crystal driver circuit, and an analog circuit in which capacitors and resistor elements are formed, may also be examples of such a circuit. Also, the memory circuit may include, for example, a DRAM, an SRAM, a flash memory or the like.

In the circuit section 120, multiple wiring layers (FIG. 1 shows only wiring layers 50 and 60) are formed to electrically connect transistors composing memories and other elements which may be included in the circuit section 120. In the semiconductor device shown in FIG. 1, the wiring layer 50 is formed on the second interlayer dielectric layer 34, and the wiring layer 60 is formed on the third interlayer dielectric layer 36.

The fuse section 110 is defined by a region including an opening section 16 that is formed over the substrate 10, as shown in FIG. 1. The opening section 16 is formed by etching a specified region of the semiconductor device from the side of the passivation layer 40 to an intermediate section of the third interlayer dielectric layer 36. The fuses 20 are formed at a bottom section 16a of the opening section 16. Also, peripheral areas of the fuses 20 are covered by the third interlayer dielectric layer 36. In other words, the fuses 20 are embedded in the third interlayer dielectric layer 36, and adjacent ones of the fuses 20 are mutually insulated from one another by the third interlayer dielectric layer 36.

In the semiconductor device embodiment shown in FIG. 1, the fuses 20 are formed at the same level as that of the wiring layer 50 formed in the circuit section 120. The wiring layer 50 and the fuses 20 can be formed by the same patterning process. Therefore, both of the wiring layer 50 and the fuses 20 are formed on the second interlayer dielectric layer 34, have generally the same film thickness, and are formed from the same material. For example, the wiring layer 50 and the fuses 20 can be formed from materials including aluminum, copper, polysilicon, tungsten or titanium.

In the semiconductor device in accordance with the present embodiment, one example, in which the fuses 20 are formed in a layer at the same level as that of a wiring layer (the wiring layer 50) below the uppermost wiring layer 60 among the wiring layers composing the circuit section 120, is shown. However, the position where the fuses 20 may be formed is not limited to this layer, but they may be formed, for example, in a layer at the same level of another one of the wiring layers.

However, the fuses may preferably be formed in a layer at the same level as that of a wiring layer below the uppermost wiring layer 60 among the wiring layers constituting the circuit section. Reasons for this are described below. Let one assume an example in which the fuses 20 are formed in a layer at the same level of the uppermost wiring layer 60. In this example, wirings that are pulled up to the fuses 20 need to be drawn around because of restrictions imposed by the design rule, and therefore the degree of freedom in the circuit design is degraded. In other words, the length of the wirings to contact the fuses with transistors at lower levels may lead to problems. Also, since a pad wiring layer is normally formed at the same level as that of the uppermost wiring layer, the film thickness of an insulation layer formed on the fuses and the film thickness of an insulation layer formed on the pad wiring layer are generally equal to each other. Accordingly, if the process of removing the insulation layer formed on the pad wiring layer and the process of removing the insulation layer on the fuses were simultaneously conducted, it would not be possible to leave the insulation layer on the fuses 20.

In contrast, when the fuses 20 are formed in a layer at the same level as that of a wiring layer below the uppermost wiring layer 60, the necessity of drawing around wiring layers is reduced, and the degree of freedom in the circuit design can be improved. Furthermore, the process of removing the insulation layer on the pad wiring layer and the process of removing the insulation layer on the fuses can be simultaneously conducted, such that the efficiency in the manufacturing process can be improved.

Also, in the semiconductor device embodiment shown in FIG. 1, layers of high melting point metal nitride 22 and 24 are formed on bottom surfaces and top surfaces of the fuses 20, respectively. Each of the layers of high melting point metal nitride 22 and 24 is formed from a layer of high melting point metal nitride or a stacked layer of layers of high melting point metal and high melting point metal nitride. In the case of a stacked layered structure of high melting point metal and high melting point metal nitride, the layer of high melting point metal defines a lower layer. For example, a titanium nitride layer or a stacked layer of titanium and titanium nitride layers may be listed as an example of the layers of high melting point metal nitride 22 and 24. Similarly, layers of high melting point metal nitride 52 and 54 are formed respectively on a bottom surface and a top surface of the wiring layer 50 that composes the circuit section 120. The layers of high melting point metal nitride 52 and 54 are also formed with the same process in which the layers of high melting point metal nitride 22 and 24 are formed on the bottom surface and the top surface of the fuses 20.

The layers of high melting point metal nitride 52 and 54 act to improve the reliability (such as stress migration resistance and electromigration resistance) of the wiring layer 50. Furthermore, the nitride layer 54 may be used as a reflection preventing film in a photolithography process to process the wiring layer 50.

The fuses 20, each having a specified width W and a specified film thickness T, are arranged at a specified pitch X, as shown in FIGS. 1 and 2. It is noted that, in here, the width W and the film thickness T of the fuse 20 respectively correspond to a width and a film thickness of the fuse 20 in a cross section thereof when the fuse 20 is cut in a plane perpendicular to a longitudinal direction of the fuse 20.

To accurately blow the fuse 20, the width W of the fuse 20 and the film thickness T of the fuse 20 may preferably have a relation given by Equation (1) below, and the width W of the fuse 20 may preferably be 3 μm or less, and the film thickness T of the fuse 20 may preferably be 0.7 μm or less.

$T \geq 0.4/W$ Equation (1)

FIG. 3 shows a result of fusing experiments conducted on the fuses 20 with their width W and film thickness T being varied. In FIG. 3, fuses that are accurately fused are indicated by ○, and fuses that are not accurately fused are indicated by Δ. In here, the cases in which the fuses are not accurately fused include cases in which a fuse is not blown, and cases in which, although a fuse is blown but a functional deficiency has occurred in the apparatus after fusing, such as a case in which cracks are generated in an insulation layer around the fuse when the fuse is blown. The fusing experiments were conducted on nine types of fuses that are formed from aluminum with the film thickness T being 5 μm, 0.35 μm or 0.50 μm, and the width W being 1.0 μm, 1.5 μm and 2.0 μm, using a laser beam with a wavelength of 1.3 μm. As a result, those of the fuses having the width W and film thickness T in a region indicated by hatched lines in FIG. 3 could be fused. Here, the region indicated by the hatched lines in FIG. 3 satisfies Equation (1); and in this region, the width W of the fuse 20 is 3 μm or less, and the film thickness T of the fuse 20 is 0.7 μm or less. The experiment result shown in FIG. 3 indicates that, when the width W and the film thickness T of the fuses 20 are in this region indicated with the hatched lines, the fuses can be accurately blown.

In the case of fuses in which the width W and the film thickness T of the fuse are outside the region shown in FIG. 3, the fuses are not correctly or accurately fused because they are not blown at all, or cracks are generated in the insulation layer around the fuses upon fusing the fuses. It is assumed that this may be caused by the fact that, because the amount of component of the fuse (in this case, aluminum, for example) that fuses and vaporizes by the irradiation of a laser beam is not sufficient, the fuses cannot be accurately fused. In contrast, when the width W and the film thickness T of the fuse satisfy the relation represented by Equation (1), the width W of the fuse 20 is 3 μm or less, and the film thickness T of the fuse 20 is 0.7 μm or less, the fuse can be accurately fused. As a result, the production yield of semiconductor devices can be improved.

Furthermore, the width W and the film thickness T of the fuse 20 more preferably have a relation indicated by Equation (2) below. When the width W and the film thickness T of the fuse 20 have the relation indicated by Equation (2) below, the fuse 20 can be further miniaturized, and the fuse 20 can be more stably and accurately fused.

$T=A/W$ (where, $A$ is $0.4 \leq A \leq 0.6$) Equation (2)

In particular, when the fuse 20 is formed from aluminum, and the width W and the film thickness T are set in a range of $0.45 \leq A \leq 0.5$, the fuse 20 is stably and accurately fused.

Also, the width W of the fuse 20 may preferably be less than ½ of the pitch X of the fuses 20, and more preferably less than ⅔ of the pitch X. If the width W of the fuse 20 were ½ or greater than the pitch X of the fuses 20, a ratio of line to space (line/space) of the fuses 20 exceeds one (1), and the line has a greater proportion, which reduces the margin in a photolithography process. The reduction in the margin in a photolithography process may cause a problem in that, when the fuse section 110 and the circuit section 120 are formed in the same layer, processes according to the design rule cannot be conducted in the circuit section 120. For this reason, the width W of the fuse 20 may preferably be less than ½ of the pitch X of the fuses 20.

Furthermore, in order to securely insulate adjacent ones of the fuses 20 from one another after fusing, the width W of the fuse 20 may preferably be less than ⅔ of the pitch X of the fuses 20. If the pitch X is too large for the width W of the fuse 20, the fuse section 110 cannot be miniaturized. Therefore, the width W of the fuse 20 and the pitch X need to be determined in a manner to achieve the miniaturization of the fuse section 110 and to securely insulate the adjacent ones of the fuses 20 from one another.

Moreover, the width W of the fuse 20 may preferably be two times or greater than the film thickness T of the fuse 20, more preferably 3 times or greater, and even more preferably 4 times or greater in certain embodiments. When the width W of the fuse 20 is at least two times or greater than the film thickness T of the fuse 20, the component material of the fuse 20 would more readily vaporize, and the fuses can be more stably fused, compared to a fuse having a width and a film thickness generally equal to each other.

In particular, when the width W of the fuse 20 is between 1.0 μm and 3.0 μm, the film thickness T of the fuse is between 0.25 μm and 0.7 μm, and the pitch X of the fuses is between 2.0 μm and 10.0 μm, and when the width W and film thickness T of the fuse 20 and the pitch X satisfy the relation described above, the fuses can be more correctly and accurately fused.

Also, as described above, the third interlayer dielectric layer 36 covers the fuses 20. The film thickness of the third interlayer dielectric layer 36 formed over the fuses 20 may preferably be between 0.2 μm and 1 μm. When the layer of high melting point metal nitride 24 is formed on the fuses 20, for example, in the semiconductor device in accordance with the present embodiment, the film thickness of the third interlayer dielectric layer 36 that is formed on the layer of high melting point metal nitride 24 may preferably be between 0.2 μm and 1 μm.

When the film thickness of the third interlayer dielectric layer 36 that is formed on the layer of high melting point metal nitride 24 is less than 0.2 μm, there is a possibility in that water may penetrate into the semiconductor device through the fuses 20. On the other hand, when the film thickness of the third interlayer dielectric layer 36 that is formed on the layer of high melting point metal nitride 24 exceeds 1 μm, the following problem may occur. When a laser beam with a wavelength of 1.3 μm is used to fuse the fuse 20 of aluminum, the power of the laser beam may have to be intensified to reach the laser beam onto the fuse 20, or the fuse 20 cannot be fused unless the time for irradiation of the laser beam is extended. When the time for the laser beam irradiation is extended, a problem may occur in that the throughput lowers. Also, the intensified laser beam may affect adjacent fuses. In contrast, when the film thickness of the third interlayer dielectric layer 36 formed on the layer of high melting point metal nitride 24 is between 0.2 μm and 1 μm, the fuses 20 can be accurately fused by irradiation of the laser beam without harming the reliability of the semiconductor device. As a result, the production yield of the semiconductor devices is further improved.

Figure 4:
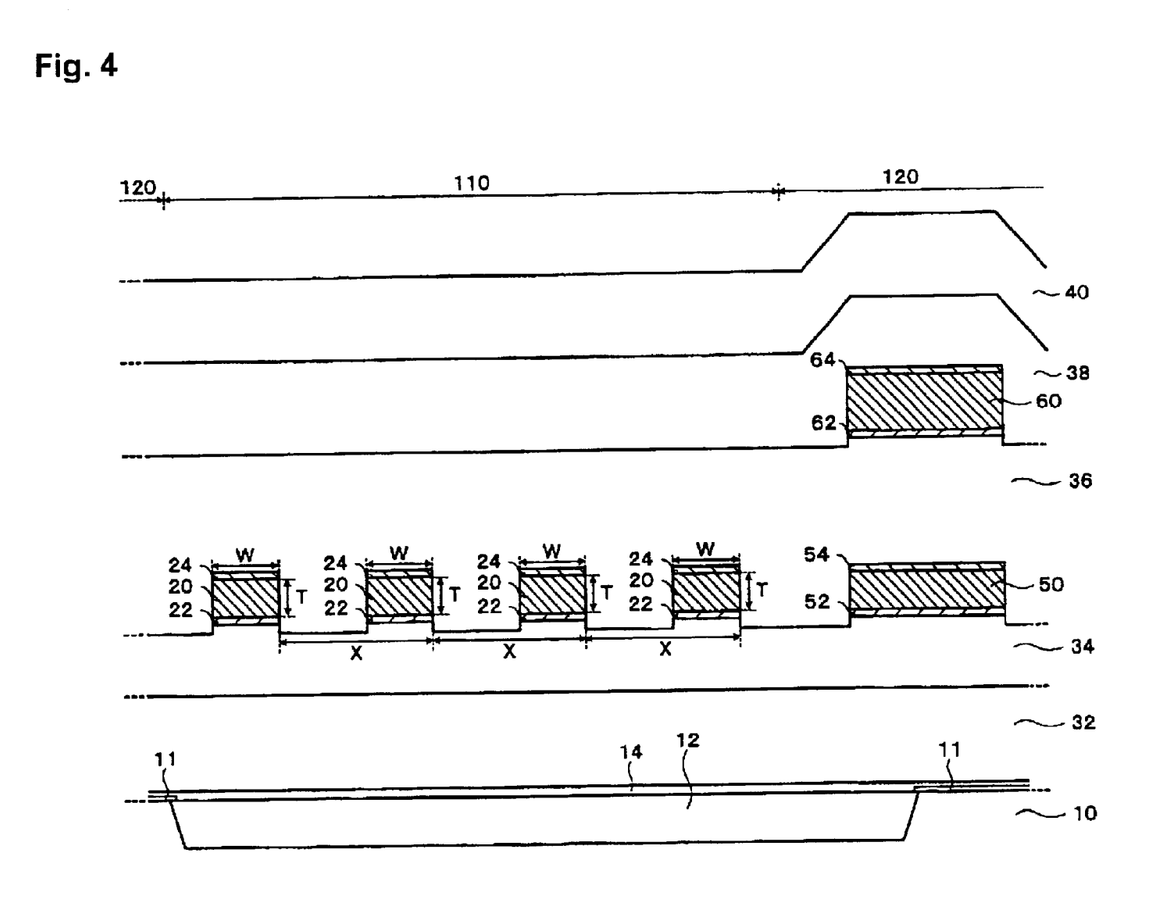
FIG. 4 schematically shows in cross section a step for manufacturing the semiconductor device shown in FIG. 1.

Next, one example of a method for manufacturing the semiconductor device in accordance with the embodiment shown in FIG. 1 will be described with reference to FIG. 4. FIG. 4 schematically shows in cross section a step for manufacturing the semiconductor device shown in FIG. 1.

First, after an element isolation region 12 is formed in a silicon substrate 10, a resist in a specified pattern is formed on the substrate, and then wells are formed at specified locations by an ion implantation. Then, transistors are formed on the silicon substrate 10, and thereafter a silicide layer 11 including high melting point metal such as titanium or cobalt is formed by a known salicide technique. Then, a stopper layer 14 of silicon nitride as a main component is formed by a plasma CVD method or the like.

Next, fuses 20 in a fuse section 110 and wiring layers including wiring layers 50 and 60 (only wiring layers 50 and 60 are shown in the figure) in a circuit section 120 are formed, and first-fourth interlayer dielectric layers 32, 34, 36 and 38 are successively deposited in layers. The first-fourth interlayer dielectric layers 32, 34, 36 and 38 may be formed by an HDP method, an ozone TEOS (tetraethylorthosilicate) method, or a plasma CVD method, and may be planarized if necessary.

The fuses 20 are formed in a layer at the same level as that of the wiring layer 50 in the same process. In other words, the fuses 20 and the wiring layer 50 are formed on the second interlayer dielectric layer 34, and formed from the same material.

A process for forming the fuses 20 will be described below.

First, after the first and second interlayer dielectric layers 32 and 34 are formed, a layer of high melting point metal nitride such as titanium nitride, a metal layer of aluminum having a film thickness T, and a stacked layer of a layer of high melting point metal such as titanium and a layer of high melting point metal nitride such as titanium nitride are formed by a sputtering method, and then these layers are patterned in specified shapes. Through these steps, the layers of high melting point metal nitride 22 and 52 are formed from the layer of high melting point metal nitride, the fuses 22 and the wiring layer 50 are formed from the metal layer of aluminum, and the layers of high melting point metal nitride 24 and 54 are formed from the stacked layer of a layer of high melting point metal and the layer of high melting point metal nitride. In the patterning step, as shown in FIG. 4, the fuses 20, each having a width W, are formed at a pitch X, and the wiring layer 50 is also formed in a film thickness T, like the fuses 20. Then, after the third interlayer dielectric layer 36 is formed, a wiring layer 60 having layers of high melting point metal nitride 62 and 64 formed respectively at its bottom surface and top surface is formed by sputtering and patterning steps just as the wiring layer 50 is formed. Also, contact sections for electrically connecting the wiring layers are formed in each of the interlayer dielectric layers. The contact section is formed through forming a contact hole that passes through each of the interlayer dielectric layers, and a conductive material is embedded in the contact hole by, for example, a sputtering method. Further, after the fourth interlayer dielectric layer 38 is formed, a passivation layer 40 formed from silicon nitride layer or the like is formed on the fourth interlayer dielectric layer 38.

Figure 5:
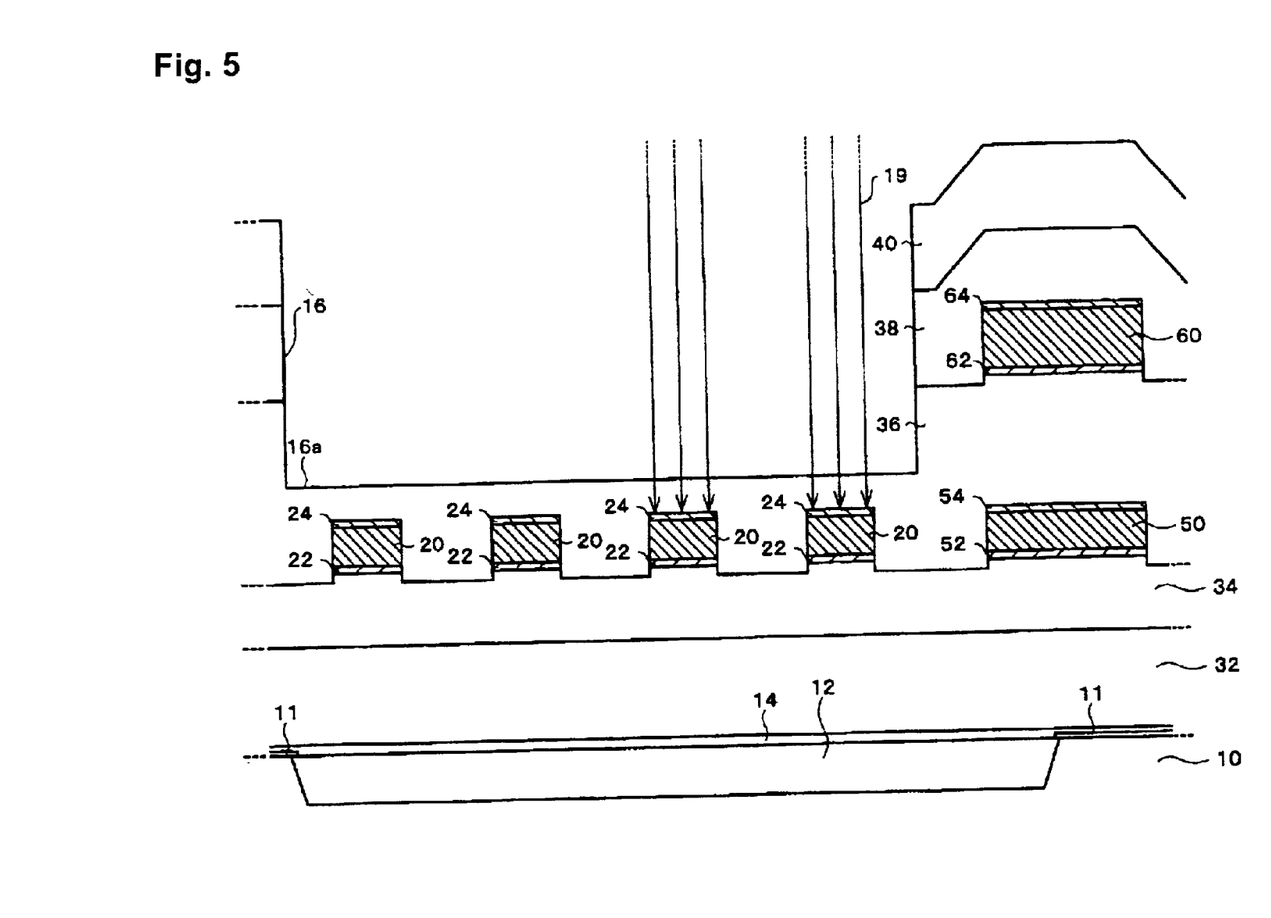
FIG. 5 schematically shows in cross section a step of fusing the fuses conducted on the semiconductor device shown in FIG. 1.

Next, a specified region of the semiconductor device is etched from the side of the passivation layer 40 to an intermediate position in the third interlayer dielectric layer 36, to thereby form an opening section 16, as shown in FIG. 5. In this step, the opening section 16 is formed such that the fuses 20 are located in a bottom section 16a of the opening section 16. Also, in order to prevent corrosion of the fuses 20, the third interlayer dielectric layer 36 is etched such that upper portions of the fuses 20 are covered by the third interlayer dielectric layer 36, as shown in FIG. 4. In other words, the third interlayer dielectric layer 36 is etched such that at least the fuses 20 are not exposed.

Figure 6:
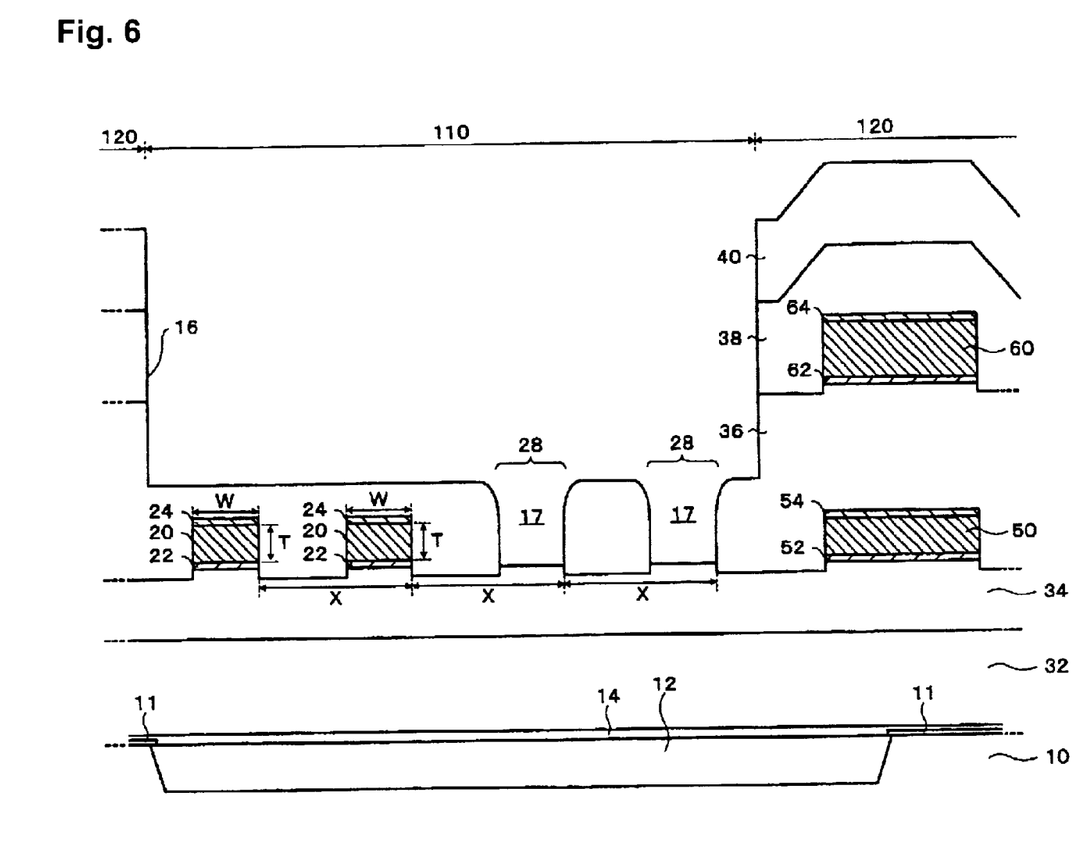
FIG. 6 schematically shows a cross section of fuses that are fused in the step shown in FIG. 5.

Next, one example of a process for fusing the fuses 20 formed in the semiconductor device shown in FIG. 1 will be described with reference to FIGS. 5 and 6. FIG. 5 schematically shows in cross section a step of fusing the fuses 20. FIG. 6 schematically shows a cross section of fuses 28 that are fused.

As shown in FIG. 5, in order to use a redundant memory cell, a laser beam 19 from a laser beam source is irradiated onto each of the corresponding fuses 20. As a result, those of the fuses 20 irradiated by the laser beam 19 are blown. Appropriate wavelength and power of the laser beam may be determined in view of the material and film thickness of the fuses 20, the layer of high melting point metal nitride 24 formed on the top surfaces of the fuses 20, and the third interlayer dielectric layer 36 formed on the layer of high melting point metal nitride 24.

FIG. 6 schematically shows the fuses 28 that are fused by the step shown in FIG. 5. When the fuses 20 shown in FIG. 5 are fused, the layers of high melting point metal nitride 22 and 24 and the third interlayer dielectric layer 36 formed on the fuses 20 are removed together with the fuses 20, and grooves 17 are formed in the fuse section 110, as shown in FIG. 6.

It is noted that the present invention is not limited to the embodiments described above, and many changes can be made within the scope of the present invention.

What is claimed:

1. A semiconductor device comprising:
   a plurality of wiring layers formed at different levels within the device, including an uppermost wiring layer;

a plurality of fuses arranged at a specified pitch X, wherein the fuses are adapted to be fused by irradiation of a laser beam;

the plurality of fuses being positioned at a level within the device that is lower than the uppermost wiring layer; and an insulation layer formed in a manner to cover the fuses;

wherein the fuses have a width W of 3 μm or less;

the fuses have a film thickness T of 0.7 μm or less; and the width W and the film thickness T of the fuses satisfies Equation (1) as follows:

$$T \geq 0.4/W \quad \text{Equation (1).}$$

2. A semiconductor device according to claim 1, wherein the width W of the fuses is less than ½ of the specified pitch X.

3. A semiconductor device according to claim 2, wherein the width W of the fuses is two times or greater than the film thickness T of the fuse.

4. A semiconductor device according to claim 1, wherein the width W of the fuses is two times or greater than the film thickness T of the fuse.

5. A semiconductor device according to claim 1, wherein the film thickness T of the fuses is between 0.25 μm and 0.7 μm.

6. A semiconductor device according to claim 1, wherein the width W of the fuses is between 1.0 μm and 3.0 μm.

7. A semiconductor device according to claim 1, wherein the pitch X of the fuses is between 2.0 μm and 10.0 μm.

8. A semiconductor device according to claim 1, wherein the insulation layer has a film thickness between 0.2 μm and 1 μm.

9. A semiconductor device according to claim 1, wherein the fuses are formed at a bottom section of an opening section formed on a substrate including a semiconductor region.

10. A semiconductor device according to claim 1, further comprising a circuit section in which the plurality of wiring layers are located, and the fuses are formed in a layer at a level identical with that of one of the wiring layers of the circuit section.

11. A semiconductor device according to claim 10, wherein the film thickness T of the fuses is generally equal to a film thickness of one of the wiring layers of the circuit section.

12. A semiconductor device according to claim 1, wherein the fuses are formed from material comprising, as a main component, at least one of aluminum, copper, polysilicon, tungsten and titanium.

13. A semiconductor device according to claim 1, wherein the width W and the film thickness T of the fuses satisfies Equation (2) as follows:

$$T = A/W \text{ (where, } A \text{ is } 0.4 \leq A \leq 0.6\text{)} \quad \text{Equation (2).}$$

14. A semiconductor device according to claim 13, wherein the fuses comprise aluminum, and A in Equation (2) is 0.45 or greater but 0.5 or smaller.

15. A semiconductor device according to any one of claim 1, wherein at least one of the plurality of fuses is in a fused state.

16. A semiconductor device according to claim 1, wherein the film thickness T of the fuses is between 0.25 μm and 0.7 μm, the width W of each of the fuses is between 1.0 μm and 3.0 μm, the pitch X of each of the fuses is between 2.0 μm and 10.0 μm, and the insulation layer has a film thickness between 0.2 μm and 1 μm.

17. A semiconductor device as in claim 1, wherein the insulation layer that covers the fuses also extends between two of the plurality of wiring layers, and wherein the wiring layer is formed from fluorinated silicate glass.

18. A semiconductor device comprising:

a circuit section including a plurality of wiring layers at different levels within the semiconductor device;

a fuse section including a plurality of fuses adapted to be fused by irradiation of a laser beam, the plurality of fuses positioned at a level that is lower than that of an uppermost wiring layer in the semiconductor device;

wherein the plurality of fuses each have a thickness that is identical to that of at least one of the wiring layers in the circuit section;

wherein at least one of the plurality of fuses has a width W of 3 μm or less;

wherein the fuses have a film thickness T of 0.7 μm or less; and wherein the width W and the film thickness T of the plurality of fuses satisfies the following equation:

$$T \geq 0.4/W.$$

19. A semiconductor device as in claim 18, wherein one of the wiring layers and the plurality of fuses have an identical composition and are positioned at the same level within the semiconductor device.

20. A semiconductor device comprising:

a fuse section including a plurality of fuses;

a circuit section including at least one circuit;

the a plurality of wiring layers formed at different levels in the circuit section, including an uppermost wiring layer;

the plurality of fuses each having side surfaces and an upper surface, the plurality of fuses arranged at a specified pitch X, wherein the fuses are adapted to be fused by irradiation of a laser beam;

the plurality of fuses being positioned at a level within the device that is lower than the uppermost wiring layer; and an insulation layer extending in the fuse section and the circuit section, the insulation layer covering the upper surface and side surfaces of at least some of the fuses in the fuse section, the insulation layer positioned between wiring layers in the circuit section;

wherein the insulation layer includes an opening in the fuse section, wherein an upper surface of the insulation layer in the fuse section is at a lower level than an upper surface of the insulation layer in the circuit section;

wherein the fuses have a width W of 3 μm or less;

the fuses have a film thickness T of 0.7 μm or less; and the width W and the film thickness T of the fuses satisfies Equation (1) as follows:

$$T \geq 0.4/W \quad \text{Equation (1).}$$

21. A semiconductor device as in claim 20, wherein at least one of the fuses is electrically connected to a transistor positioned at a lower level than that of the at least one of the fuses.

22. A semiconductor device as in claim 20, wherein the insulation layer is formed from fluorinated silicate glass.

23. A semiconductor device as in claim 21, further comprising at least one additional insulation layer in the circuit section, the additional insulation layer positioned at a level above that of the insulation layer extending in the fuse section and the circuit section.

* * * * *